United States Patent
Hamaguchi et al.

(10) Patent No.: US 6,633,078 B2
(45) Date of Patent: Oct. 14, 2003

(54) SEMICONDUCTOR DEVICE, METHOD FOR MANUFACTURING AN ELECTRONIC EQUIPMENT, ELECTRONIC EQUIPMENT AND PORTABLE INFORMATION TERMINAL

(75) Inventors: Tsuneo Hamaguchi, Hyogo (JP); Kenji Kagata, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/979,188
(22) PCT Filed: Mar. 19, 2001
(86) PCT No.: PCT/JP01/02171
§ 371 (c)(1), (2), (4) Date: Nov. 20, 2001
(87) PCT Pub. No.: WO01/71806
PCT Pub. Date: Sep. 27, 2001

(65) Prior Publication Data
US 2002/0158324 A1 Oct. 31, 2002

(30) Foreign Application Priority Data
Mar. 21, 2000 (JP) .......................................... 2000-78443

(51) Int. Cl.⁷ ............................................... H01L 23/02
(52) U.S. Cl. ...................... 257/686; 257/777; 257/778
(58) Field of Search .............................. 257/760, 686, 257/777, 778, 723

(56) References Cited

U.S. PATENT DOCUMENTS

| | | | | |
|---|---|---|---|---|
| 5,994,166 A | * | 11/1999 | Akram et al. | 438/108 |
| 6,121,689 A | * | 9/2000 | Capote et al. | 257/783 |
| 6,137,164 A | * | 10/2000 | Yew et al. | 257/686 |
| 6,316,838 B1 | * | 11/2001 | Ozawa et al. | 257/778 |
| 6,437,990 B1 | * | 8/2002 | Degani et al. | 361/783 |
| 2002/0079567 A1 | * | 6/2002 | Lo et al. | 257/685 |
| 2002/0079568 A1 | * | 6/2002 | Degani et al. | 361/686 |

FOREIGN PATENT DOCUMENTS

| | | |
|---|---|---|
| JP | 7-240496 | 9/1995 |
| JP | 10-79405 | 3/1998 |
| JP | 11-312712 | 11/1999 |
| JP | 2000-031316 | 1/2000 |
| JP | 2000-200852 | 7/2000 |

* cited by examiner

Primary Examiner—Phat X. Cao
(74) Attorney, Agent, or Firm—Burns, Doane, Swecker & Mathis, LLP

(57) ABSTRACT

A semiconductor device includes projecting electrodes formed on one surface of a wiring substrate so as to have a prescribed height, a semiconductor chip having a thickness smaller than the height of the projecting electrodes, and an electronic component having a thickness larger than that of the semiconductor chip and mounted on the other surface of the wiring substrate so that the wiring substrate is warped to be recessed at the one surface. Thus, the rigidity as well as the spacing between the semiconductor chip and the mounting board are assured. Moreover, the semiconductor device having a logic LSI mounted on both surfaces of a wiring substrate is mounted on a mounting board in a housing with projecting electrodes having a prescribed height interposed therebetween, wherein the wiring substrate is warped to be recessed on the side having the projecting electrodes.

15 Claims, 11 Drawing Sheets

SEMICONDUCTOR DEVICE, METHOD FOR MANUFACTURING AN ELECTRONIC EQUIPMENT, ELECTRONIC EQUIPMENT AND PORTABLE INFORMATION TERMINAL

TECHNICAL FIELD

The present invention relates to a semiconductor device in which semiconductor chips are mounted at a high density, a method for manufacturing an electronic equipment such as a portable information terminal in which the semiconductor device is mounted, an electronic equipment, and a portable information terminal.

BACKGROUND ART

Electronic equipments including a portable information terminal such as a mobile phone must be reduced in size, and in particular in thickness. Various methods for mounting a semiconductor chip have been proposed for such reduction in size. A particularly useful method among the proposed methods is a method in which two semiconductor chips are mounted on the top surface and the back surface of a wiring board so as to face each other. There are two methods as such a method for mounting the semiconductor chips on the top surface and the back surface of a single wiring plate.

The first method is a method in which a mounting/connecting substrate is provided between a wiring board and a mounting board, and the wiring board is connected to the mounting board through the connecting substrate, enabling a semiconductor chip on the back surface to be mounted without contacting the mounting board.

FIG. 11 is a cross-sectional view of a conventional electronic equipment mounted by such a method, for example, a cross-sectional view of a conventional electronic equipment disclosed in Japanese Laid-Open Publication No. 7-240496. As shown in FIG. 11, an electronic equipment is formed with a semiconductor device mounted on a mounting board 108. The semiconductor device includes semiconductor chips 101a, 101b respectively mounted on a top surface and a back surface of a single wiring board 103. The wiring substrate 103 is bonded to, and electrically connected to, the mounting board 108 through a connecting substrate 106. More specifically, electric connection between electrodes 104 of the wiring board 103 and electrodes 116 of the connecting substrate 106 as well as electric connection between the electrodes 116 of the connecting substrate 106 and electrodes 109 of the mounting board 108 are both implemented with solder bumps 107. The thickness of the semiconductor chip 101b is herein set to a value smaller than the total thickness of the connecting substrate 106 and the solder bump 107 so that connection to the mounting board is not hindered. Note that the wiring substrate 103 is electrically connected to the first and second semiconductor chips 101a, 101b through electrodes 102. Moreover, the respective connections between the wiring board 103 and the first and second semiconductor chips 101a, 101b and the connection between the wiring board 103 and the connecting substrate 106 are sealed with a sealing resin 105.

The second method is a method in which a recess is formed at the back surface of a wiring board, and a semiconductor chip is fittingly mounted in the recess. This method also enables a semiconductor chip on the back surface to be mounted without contacting a mounting board.

FIG. 12 is a cross-sectional view of a conventional electronic equipment mounted by such a method, for example, a cross-sectional view of a conventional electronic equipment disclosed in Japanese Laid-Open Publication No. 10-79405. As shown in FIG. 12, a recess is formed at the back surface of the wiring board, and the semiconductor chip 101b is fittingly mounted in the recess. Mounting the semiconductor chip 101b in the recess enables connection between solder bumps 107 and electrodes of a mounting board (not shown) to be achieved without being disturbed by the semiconductor chip 101b. Note that the wiring substrate 103 is electrically connected to the first and second semiconductor chips 101a, 101b through electrodes 102. Moreover, the respective connections between the wiring board 103 and the first and second semiconductor chips 101a, 101b are sealed with a sealing resin 105.

The first and second methods thus enable the wiring substrate to be mounted on the mounting board so that the semiconductor chip on the back surface does not contact the mounting board.

However, the first method necessitates the use of an expensive connecting substrate, increasing the manufacturing costs of the electronic equipment. Moreover, since the wiring substrate is bonded to the mounting board through the connecting substrate, the total thickness is increased due to insertion of the connecting substrate, hindering reduction in thickness.

The second method necessitates formation of a recess in the wiring board, which requires special man-hour. Accordingly, this method also increases the manufacturing costs of the electronic equipment.

One possible way to mount on the mounting board the wiring substrate having a semiconductor chip mounted on both surfaces thereof without using any connecting substrate and without forming any recess in the wiring substrate is to reduce the thickness of the semiconductor chip 101b as much as possible. In this case, however, reduction in thickness of the semiconductor chip 101b reduces the rigidity, resulting in degraded reliability and the like.

Moreover, it is now assumed that the semiconductor chip 101b and the mounting board 108 have a small gap therebetween. In this case, even if the semiconductor chip 101b does not contact the mounting board 108 when mounted, the mounting board 108 may be subjected to bending or torsional stresses by external pressure and the like generated when the product is in use. This would cause the surface of the semiconductor chip 101b to contact the mounting board 108, damaging the semiconductor chip 101b.

Moreover, it is now assumed that the semiconductor chip 101b and the mounting board 103 have a small gap therebetween. In this case, even if the semiconductor chip 101b does not contact the mounting board 108 when mounted, the mounting board 108 may be subjected to bending or torsional stresses by external pressure and the like generated when the product is in use. This would cause the surface of the semiconductor chip 101b to contact the mounting board 108, damaging the semiconductor chip 101b.

DISCLOSURE OF THE INVENTION

The present invention is made to solve such conventional problems as described above, and it is an object of the present invention to provide a low-cost semiconductor device including a semiconductor chip mounted on both surfaces of a wiring board without degrading electric characteristics, a method for manufacturing an electronic equipment, an electronic equipment, and a portable information terminal.

A semiconductor device according to the present invention includes: a wiring substrate including electrodes on a top surface and a back surface thereof; projecting electrodes formed on one surface of the wiring substrate so as to have a prescribed height; a semiconductor chip having a thickness smaller than the height of the projecting electrodes and mounted on the one surface of the wiring substrate so as to be electrically connected to the electrodes of the wiring substrate; and an electronic component having a thickness larger than that of the semiconductor chip and mounted on the other surface of the wiring substrate as to be electrically connected to the electrodes of the wiring substrate so that the wiring substrate is warped to be recessed at the one surface.

In such a semiconductor device, the wiring substrate is warped toward the side having the projecting electrodes (bumps) (i.e., warped so as to be recessed on the side having the projecting electrodes). Therefore, the semiconductor chip will not contact the mounting board when the wiring substrate having the semiconductor chip mounted thereon is mounted on the mounting board, enabling the semiconductor chip to be mounted without being damaged. Moreover, neither the use of a connecting substrate nor formation of a recess in the wiring substrate is required, enabling the semiconductor device to be manufactured inexpensively.

In order to warp the wiring substrate toward the side having the projecting electrodes, a linear expansion coefficient of the electronic component may be made smaller than that of the wiring substrate. This is because the degree and direction of the warping are almost determined by the electronic component and the wiring substrate. Preferably, a value of the linear expansion coefficient of the electronic component is equal to or less than that of the semiconductor chip.

In the case where the longitudinal and lateral dimensions of the semiconductor chip are the same, the wiring substrate is warped to the same degree in the longitudinal and lateral directions into a bowl shape. In the case where the longitudinal and lateral dimensions of the semiconductor chip are different, the wiring substrate is warped into a bowl shape, but the warping degree is different between the longitudinal and lateral directions. Too large warping would no longer be able to be absorbed by the projecting electrodes provided on the mounting board, and also would degrade electric characteristics at the electronic component or the semiconductor chip. Therefore, the wiring substrate is preferably warped so that a difference in level between a central portion and a peripheral portion of the wiring substrate is equal to or less than 100 $\mu$m. Moreover, since the wiring substrate must be warped, the difference in level between the central portion and the peripheral portion of the wiring substrate is more preferably in the range of 5 $\mu$m to 100 $\mu$m, and is preferably in the range of 10 $\mu$m to 40 $\mu$m in view of actual manufacturing.

The electronic component may either be a single semiconductor chip or a lamination of a plurality of semiconductor chips. In order to reliably improve the rigidity and suppress degradation in electric characteristics, the electronic component desirably has a thickness of 0.3 mm or more. On the other hand, excessively increasing the thickness of the electronic portion would result in increased thickness of the semiconductor device, which goes against the trend toward reduction in thickness. Therefore, the thickness of the electronic component is desirably about 0.65 mm or less. In order to improve the rigidity more reliably and prevent degradation in electric characteristics, the electronic component may be larger than the semiconductor chip in two-dimensional size.

For example, a printed board, a printed board having a fine wiring layer formed at its surface by means of an epoxy resin and plating, or a resin substrate formed from a polyimide resin and a conductor is preferably used as the wiring substrate.

Another semiconductor device according to the present invention includes: a wiring substrate including electrodes on a top surface and a back surface thereof; projecting electrodes formed on one surface of the wiring substrate so as to have a prescribed height; a semiconductor chip having a thickness smaller than the height of the projecting electrodes and mounted on the one surface of the wiring substrate so as to be electrically connected to the electrodes of the wiring substrate; and an electronic component mounted on the other surface of the wiring substrate so as to be electrically connected to the electrodes of the wiring substrate, the electronic component having a thickness larger than that of the semiconductor chip and having a linear expansion coefficient smaller than that of the wiring substrate.

In such a semiconductor device, the linear expansion coefficient of the electronic component is smaller than that of the wiring substrate, whereby the wiring substrate is warped toward the side having the projecting electrodes. Therefore, the semiconductor chip will not contact the mounting board when the wiring substrate having the semiconductor chip mounted thereon is mounted on the mounting board, enabling the semiconductor chip to be mounted without being damaged. Moreover, neither the use of a connecting substrate nor formation of a recess in the wiring substrate is required, enabling the semiconductor device to be manufactured inexpensively.

As described above, a resin substrate is preferably used as the wiring substrate, and the electronic component preferably has a thickness of 0.3 mm or more.

A method for manufacturing an electronic equipment according to the present invention is a method for manufacturing an electronic equipment by mounting a semiconductor device on a mounting board with projecting electrodes interposed therebetween, the semiconductor device having the projecting electrodes and a semiconductor chip both provided on a mounting side thereof, and having an electronic component provided on a side opposite to the mounting side, wherein the semiconductor chip has a thickness smaller than a height of the projecting electrodes, the electronic component has a thickness larger than that of the semiconductor chip, and the semiconductor device is mounted on the mounting board with the projecting electrodes interposed therebetween by aligning with the mounting board the semiconductor device warped so as to be recessed on the mounting side, and pressing the semiconductor device against the mounting board with the semiconductor device being in the warped state.

In such a manufacturing method of an electronic equipment, the wiring substrate is mounted on the mounting board while being warped so as to be recessed on the side facing the mounting board. Therefore, even if there is only a small difference between the height of the projecting electrodes provided on the wiring substrate and the thickness (height) of the semiconductor chip, the semiconductor chip is mounted without contacting the mounting board. Thus, the semiconductor chip can be prevented from being damaged due to contact with the mounting board.

In order to warp the wiring substrate toward the side having the projecting electrodes, a linear expansion coefficient of the electronic component may be made smaller than that of the wiring substrate. In this case, since the wiring substrate has a larger linear expansion coefficient than the electronic component, the wiring substrate is subjected to larger shrinkage than the electronic component when cooled. Accordingly, the wiring substrate is shrunk more than the electronic component, whereby the wiring substrate is warped into a bowl shape so as to project toward the electronic component. Preferably, a value of the linear expansion coefficient of the electronic component is equal to or less than that of the semiconductor chip.

This semiconductor device may be manufactured by a manufacturing process including the steps of bonding the electronic component to the wiring substrate with heating and then cooling the resultant wiring substrate, thereby mounting the electronic component on the wiring substrate such that the wiring substrate is warped so as to be recessed on the mounting side, mounting the semiconductor chip on the mounting side of the wiring substrate, and forming the projecting electrodes on the mounting side of the wiring substrate.

An electronic equipment according to the present invention includes: a mounting board; a wiring substrate including electrodes on a top surface and a back surface thereof and mounted on the mounting board with projecting electrodes interposed therebetween, the projecting electrodes having a prescribed height; a semiconductor chip having a thickness smaller than the height of the projecting electrodes and mounted on a surface of the wiring substrate facing the mounting board such that the semiconductor chip is disposed in a space between the mounting board and the wiring substrate and electrically connected to the electrodes of the wiring substrate; and an electronic component mounted on a surface of the wiring substrate opposite to that facing the mounting board such that the electronic component is electrically connected to the electrodes of the wiring substrate, the electronic component having a thickness larger than that of the semiconductor chip and having a linear expansion coefficient smaller than that of the wiring substrate.

A portable information terminal according to the present invention includes: a housing; a mounting board mounted in the housing; a logic LSI chip mounted on the mounting board; a wiring substrate including electrodes on a top surface and a back surface thereof and mounted on the mounting board with projecting electrodes interposed therebetween, the projecting electrodes having a prescribed height; a memory or logic LSI chip having a thickness smaller than the height of the projecting electrodes and mounted on a surface of the wiring substrate facing the mounting board such that the memory or logic LSI chip is disposed in a space between the mounting board and the wiring substrate and electrically connected to the electrodes of the wiring substrate; and an electronic component mounted on a surface of the wiring substrate opposite to that facing the mounting board such that the electronic component is electrically connected to the electrodes of the wiring substrate, the electronic component having a thickness larger than that of the semiconductor chip and having a linear expansion coefficient smaller than that of the wiring substrate.

In such an electronic equipment and a portable information terminal, the semiconductor chip such as memory or logic LSI chip can be mounted on the mounting board at a prescribed distance without contacting the mounting board, enabling the semiconductor chip to be mounted without being damaged. Accordingly, an electronic equipment and a portable information terminal can be provided that are advantageous in terms of reduction in size and weight.

As described above, a resin substrate is preferably used as the wiring substrate, and the electronic component preferably has a thickness of 0.3 mm or more.

BRIEF DESCRIPTION OF THE DRAWINGS

FIG. 6A shows the state in which an electronic component is mounted on the top surface of a wiring substrate. FIG. 6B shows the state in which a semiconductor chip is mounted on the back surface of the wiring substrate. FIG. 6C shows the state in which projecting electrodes have been formed on the back surface of the wiring substrate;

FIG. 7A shows the state that a conductive connecting material has been formed on electrodes of a mounting board. FIG. 7B shows the state in which a semiconductor device is mounted on the mounting board. FIG. 7C show the state in which the mounting board was heated and then cooled to room temperature;

BEST MODE FOR CARRYING OUT THE INVENTION

The present invention will now be described in more detail in conjunction with the accompanying drawings.

First Embodiment

Figure 1:
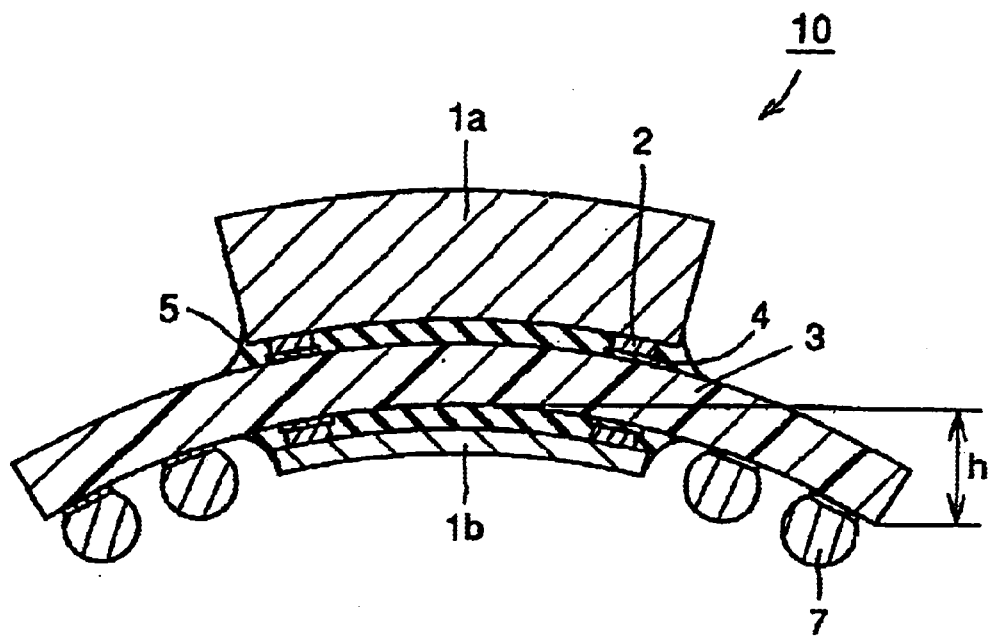
FIG. 1 is a cross-sectional view showing the schematic structure of a semiconductor device according to a first embodiment of the present invention.

FIG. 1 is a cross-sectional view showing the schematic structure of a semiconductor device according to the first embodiment of the present invention, wherein warping is emphasized as compared to the actual state. In FIG. 1, a first semiconductor chip 1*a* (electronic component) is mounted on the top surface and a second semiconductor chip 1*b* is mounted on the back surface of a wiring board 3, and connection electrodes 2 provided on the surface of each semiconductor chip are electrically connected to corresponding electrodes 4 of the wiring board 3. The connections between the electrodes are covered with a sealing resin 5 for protection. On the back surface of the wiring board 3 are formed solder bumps 7 serving as projecting connection electrodes fox electric connection with electrodes on a mounting board (not shown).

In the present embodiment, the thickness of the second semiconductor chip 1b is smaller than the height of the solder bump 7 so that the second semiconductor chip 1b can be mounted on the back surface of the wiring substrate 3, that is, between the mounting board and the wiring substrate. Moreover, the thickness of the first semiconductor chip 1a is larger than that of the second semiconductor chip 1b so that rigidity as the semiconductor device 10 can be assured. Further, the wiring substrate 3 is warped so as to be recessed at the back surface on which the second semiconductor chip 1b is mounted, so that the second semiconductor chip 1b will not contact the mounting board.

For example, provided that the first semiconductor chip 1a of about 0.4 mm in thickness and the second semiconductor chip 1b of about 0.15 mm in thickness are connected to the wiring substrate 3 of about 0.4 mm in thickness, and the solder bumps 7 are formed with a height (thickness) of about 0.3 mm or less, the semiconductor device 10, a complex of these elements, is warped by about 10 $\mu$m without producing any small undulation. This warping will not degrade the electric characteristics.

This warping can be controlled by changing the thickness of the first semiconductor chip 1a and the second semiconductor chip 1b. The thickness of the second semiconductor chip 1b is preferably about 66% or less of that of the first semiconductor chip 1a, and is preferably about 50 $\mu$m or more from the standpoint of assuring the rigidity.

In the case where the longitudinal and lateral dimensions of the semiconductor chip are the same, the wiring substrate 3 is warped to the same degree in the longitudinal and lateral directions into a bowl shape. In the case where the longitudinal and lateral dimensions of the semiconductor chip are different, the wiring substrate 3 is warped into a bowl shape, but the warping degree is different between the longitudinal and lateral directions. Too large warping would no longer be able to be absorbed by the projecting electrodes 7 provided on the mounting board, and also would degrade electric characteristics at the first semiconductor chip 1a or the second semiconductor chip 1b. Therefore, the semiconductor substrate 3 is preferably warped so that the difference in level between the central portion and the peripheral portion of the wiring substrate 3 is 100 $\mu$m or less. Since the wiring substrate 3 must be warped, the difference in level between the central portion and the peripheral portion of the wiring substrate 3 is more preferably in the range of about 5 $\mu$m to 100 $\mu$m, and is preferably in the range of 10 $\mu$m to 40 $\mu$m in view of actual manufacturing.

In order to reliably increase the rigidity and suppress degradation in electric characteristics, the thickness of the first semiconductor chip 1a is desirably 0.3 mm or more. On the other hand, excessively increasing the thickness of the electronic portion would result in increased thickness of the semiconductor device 10, which goes against the trend toward reduction in thickness. Therefore, the thickness of the first semiconductor chip 1a is desirably about 0.65 mm or less.

If the wiring substrate is slightly buckled, which appears as small undulations, the semiconductor chip mounted thereon is subjected to non-uniform in-plane stresses, resulting in degradation in electric characteristics. In the present embodiment, however, the wiring substrate is not locally but generally warped. Therefore, although the semiconductor chip is generally warped, distortion and residual stresses that are actually produced in the material of the semiconductor chip are limited to a very small value as compared to the case of the aforementioned periodic slight buckling, and the electric characteristics will not be degraded.

Second Embodiment

In FIG. 1, a silicon chip having a linear expansion coefficient of about $3.5 \times 10^{-6}$ (1/° C.) and a thickness of 0.3 mm or more was used as the first semiconductor chip 1a, and a printed wiring board having a linear expansion coefficient of about $16 \times 10^{-6}$ (1/° C.) and a thickness of about 0.6 mm was used as the wiring substrate 3. A resin having a large linear expansion coefficient of about $50 \times 10^{-6}$ (1/° C.) was used as the resin for protecting the connections between the electrodes. However, this resin has a small thickness of about 0.3 mm, and therefore do not significantly affect the degree and direction of the warping. Accordingly, the degree and direction of the warping can be determined by the first semiconductor chip 1a and the wiring substrate 3. The wiring substrate 3 that has large shrinkage when cooled is shrunk more than the first semiconductor chip 1a, whereby the wiring substrate 3 can be warped so as to be recessed at the second semiconductor chip 1b.

In the present embodiment, the difference in level, h, between the central portion and the peripheral portion of the wiring substrate 3 in FIG. 1 was about 10 $\mu$m. This difference in level, h, is desirably 100 $\mu$m or less in order to assure connection between the solder bumps 7 and the electrodes of the wiring substrate 3.

Moreover, in the present embodiment, the warping was calculated with various thicknesses of the first semiconductor chip 1a, the second semiconductor chip 1b and the wiring board 3. When the thickness of the first semiconductor chip 1a is less than 0.3 mm, the rigidity is significantly reduced, whereby the warping is abruptly increased. It is therefore preferable to set the thickness of the first semiconductor chip 1a to 0.3 mm or more so as to prevent reduction in rigidity of the semiconductor device 10 as a complex.

Thus setting the thickness of the first semiconductor chip 1a to 0.3 mm or more and the thickness of the second semiconductor chip 1b to a value smaller than that of the first semiconductor chip 1a facilitates generation of the warping and suppresses the warping within a fixed range.

Third Embodiment

In FIG. 1, a silicon chip having a linear expansion coefficient of about $3.5 \times 10^{-6}$ (1/° C.) and a thickness of about 0.15 mm was used as the first semiconductor chip 1a, a gallium arsenide (GaAs) chip having a linear expansion coefficient of about $5.7 \times 10^{-6}$ (1/° C.) and a thickness of about 0.15 mm was used as the second semiconductor chip 1b, and a printed wiring board having a linear expansion coefficient of about $16 \times 10^{-6}$ (1/° C.) and a thickness of about 0.6 mm was used as the wiring substrate 3.

In the present embodiment, the degree and direction of the warping can be determined by the first semiconductor chip 1a and the second semiconductor chip 1b. The second semiconductor chip 1b having large shrinkage when cooled is shrunk more than the first semiconductor chip 1a, whereby the wiring substrate 3 can be warped so as to be recessed at the second semiconductor chip 1b.

Fourth Embodiment

Figure 2:
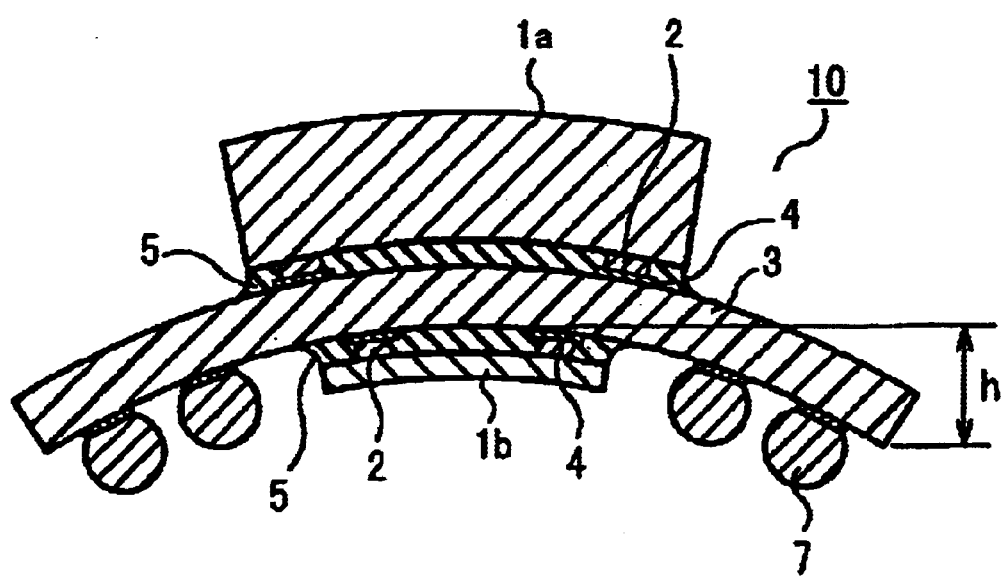
FIG. 2 is a cross-sectional view showing the schematic structure of a semiconductor device according to a fourth embodiment of the present invention.

FIG. 2 is a cross-sectional view showing the schematic structure of a semiconductor device according to the fourth embodiment of the present invention, wherein warping is emphasized as compared to the actual state. In FIG. 2, a first semiconductor chip 1a (electronic component) is mounted on the top surface and a second semiconductor chip 1b is mounted on the back surface of a wiring board 3, and connection electrodes 2 provided on the surface of each semiconductor chip are electrically connected to corresponding electrodes 4 of the wiring board 3. The connections between the electrodes are covered with a sealing resin 5 for protection. On the back surface of the wiring board 3 are formed solder bumps 7 serving as projecting connection electrodes for electric connection with electrodes on a mounting board (not shown).

In the present embodiment, the first semiconductor chip 1a and the second semiconductor chip 1b are different in two-dimensional size. Since the larger semiconductor chip is connected as the first semiconductor chip 1a, the wiring substrate 3 can be warped in the same manner as that in the first embodiment and the rigidity is improved, whereby slight buckling can be more reliably suppressed.

Fifth Embodiment

Figure 3:
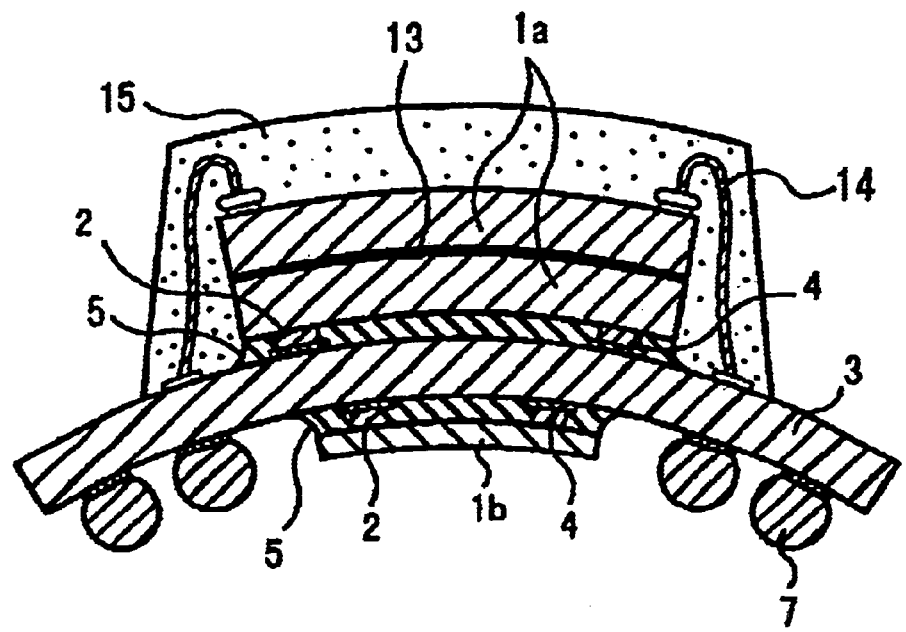
FIG. 3 is a cross-sectional view showing the schematic structure of a semiconductor device according to a fifth embodiment of the present invention.
Figure 4:
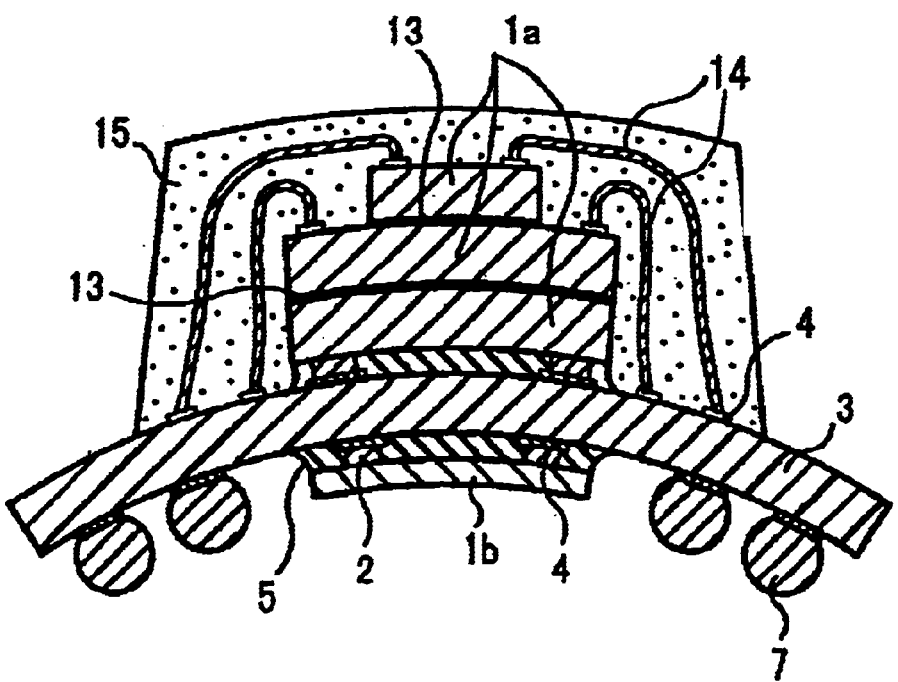
FIG. 4 is a cross-sectional view showing the schematic structure of a semiconductor device according to the fifth embodiment of the present invention.
Figure 5:
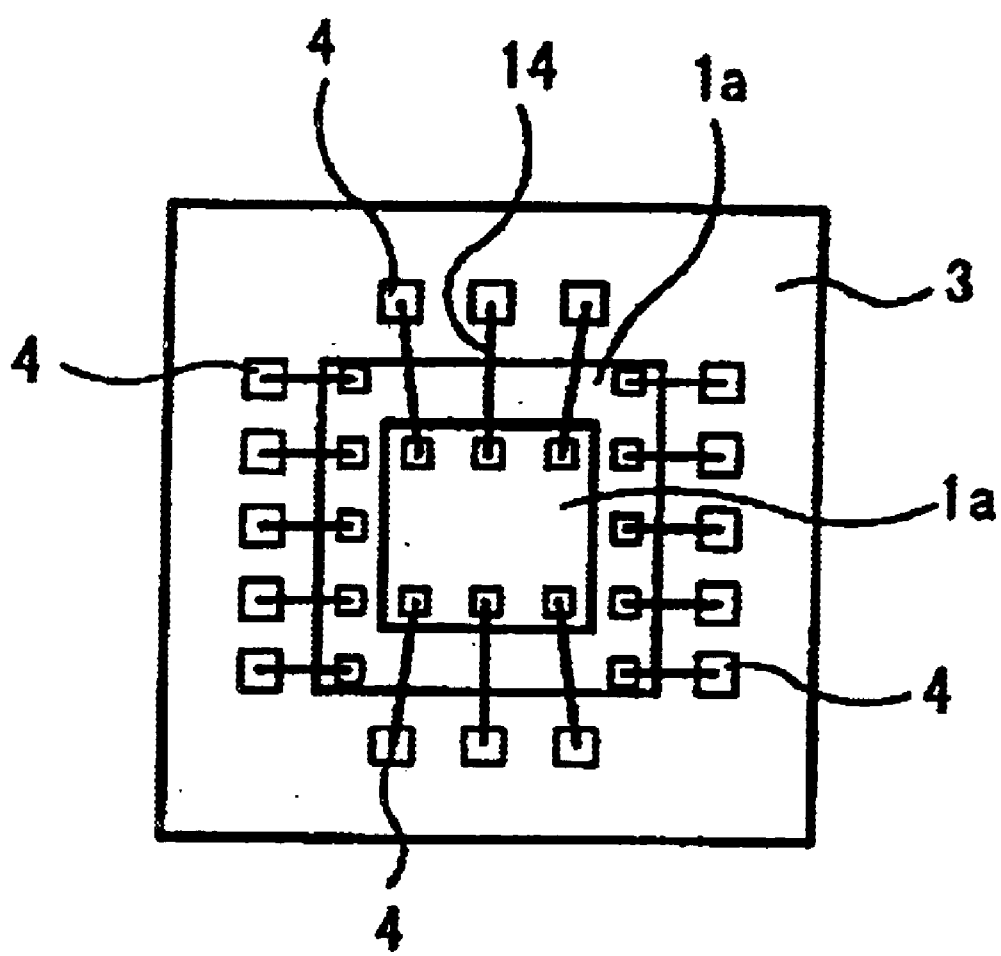
FIG. 5 is a plan view showing the schematic structure of a semiconductor device according to the fifth embodiment of the present invention.

FIG. 3 is a cross-sectional view showing the schematic structure of a semiconductor device according to the fifth embodiment of the present invention. FIG. 4 is a cross-sectional view showing the schematic structure of another semiconductor device according to the fifth embodiment of the present invention. FIG. 5 is a schematic plan view of the semiconductor device shown in FIG. 4.

In FIG. 3, an electronic component 1a is formed from two semiconductor chips, and the total thickness of the two chips is larger than the thickness of a second semiconductor chip 1b mounted on the opposite surface of a wiring substrate 3. Moreover, solder bumps 7 serving as projecting connection electrodes for electric connection with electrodes of a mounting board (not shown) are formed on the back surface of the wiring board 3.

In the present embodiment, the thickness of the second semiconductor chip 1b is smaller than the height of the solder bump 7, so that the second semiconductor chip 1b can be mounted on the back surface of the wiring substrate, that is, between the mounting board and the wiring substrate. Moreover, the thickness of the electronic component 1a is larger than that of the second semiconductor chip 1b so that rigidity as a semiconductor device can be assured. Further, the wiring substrate 3 is warped so as to be recessed at the back surface on which the second semiconductor chip 1b is mounted, so that the second semiconductor chip 1b will not contact the mounting board.

As in the first embodiment, the thickness of the electronic component 1a formed from two semiconductor chips is preferably 0.3 mm or more. The thickness of the second semiconductor chip 1b is preferably about 66% or less of that of the electronic component 1a.

Although a method for mounting the two chips is not particularly limited, it is possible to, for example, laminate the two semiconductor chips each other with an adhesive and connect electrodes of the upper semiconductor chip with electrodes of the wiring substrate 2 by using wires.

An example in which two semiconductor chips are mounted as the electronic component 1a is shown in the present embodiment. For example, however, as shown in FIG. 4, an additional semiconductor chip may be mounted so that the electronic component is formed from a plurality of semiconductor chips. For example, as shown in FIG. 5, electrodes of the plurality of semiconductor chips can be connected to the wiring substrate by using wires so that the connection wirings do not contact each other.

Sixth Embodiment

Figure 6A:
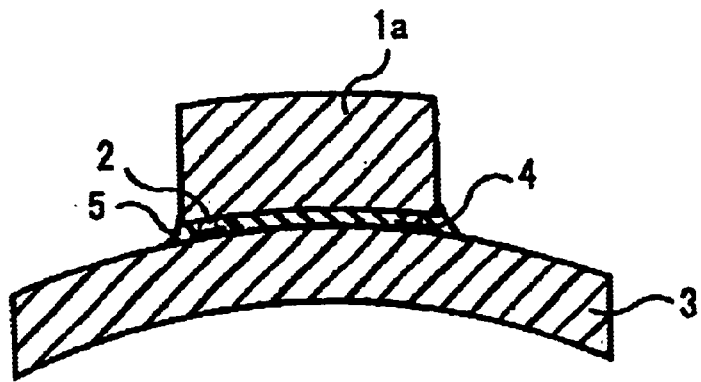
FIGS. 6A, 6B and 6C are process charts illustrating a method for manufacturing a semiconductor device according to a sixth embodiment of the present invention.
Figure 6B:
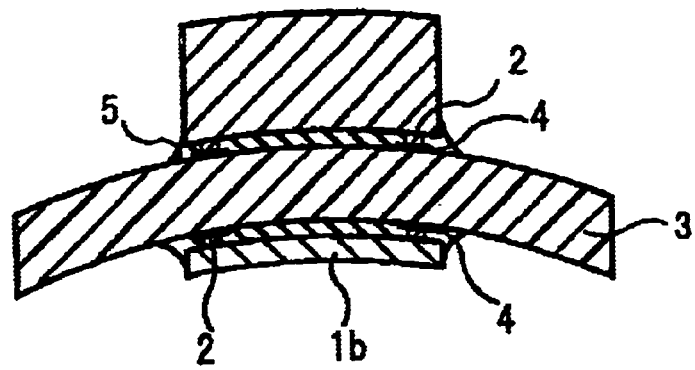
Figure 6C:
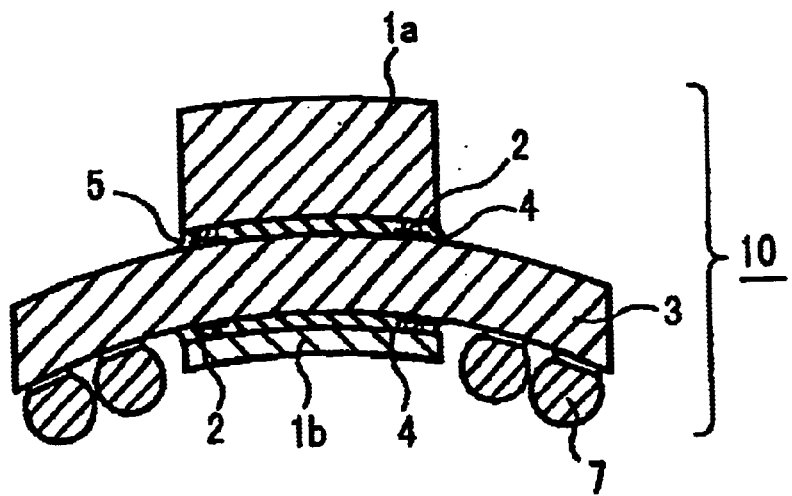

FIGS. 6A, 6B and 6C are process charts illustrating a method for manufacturing a semiconductor device according to the sixth embodiment of the present invention. In the present embodiment, as shown in FIG. 6A, connection electrodes 2 of an electronic component 1a are first aligned with respective electrodes of a wiring substrate 3. The connection electrodes 2 are melted for connection by using, e.g., a flip chip bonding method, and the gap between the electronic component 1a and the wiring substrate 3 is then filled with a sealing resin 5 in order to improve connection reliability. In the case where a substrate formed from a resin is used as the wiring substrate 3, the linear expansion coefficient thereof is about 15 to $40 \times 10^{-6}$ (1° C.), which is larger than about 3 to $6 \times 10^{-6}$ (1/° C.) of the electronic component 1a formed from a semiconductor such as silicon and gallium arsenide. Accordingly, when the electronic component 1a is connected onto the wiring substrate 3 in a heated state and then cooled to room temperature, the wiring substrate 3 is shrunk more than the electronic component 1a. Therefore, at this time, the wiring substrate 3 is warped so as to project toward the electronic component 1a.

As shown in FIG. 6B, connection electrodes 2 of a second semiconductor chip 1b are then aligned with respective electrodes 4 on the other surface of the wiring substrate 3, and connected therewith by heating and cooling in the same manner. Thereafter, the gap between the second semiconductor chip 1b and the wiring substrate 3 is filled with a sealing resin 5 in order to improve connection reliability. Since the second semiconductor chip 1b is thinner than the electronic component 1a and has small force to bend the wiring substrate 3, the wiring substrate 3 remains warped so as to project toward the electronic component 1a.

In the case where the electronic component 1a of 0.3 mm in thickness and the second semiconductor chip 1b of 0.15 mm in thickness are used, the warping is about 10 $\mu$m.

As shown in FIG. 6C, projecting electrodes 7 are then formed in the periphery of the wiring substrate 3. For example, the projecting electrodes 7 are formed by arranging solder balls 7 on the electrodes 4 of the wiring substrate 3 and melting the solder by heating. The projecting electrodes may alternatively be formed by printing cream solder on the electrodes 4 of the wiring substrate 3 and heating it. For example, in order to arrange the solder balls at intervals of 0.5 mm, solder balls having a diameter of about 0.3 mm are used. In this case, the projecting electrodes 7 have a height of about 0.23 mm. Accordingly, provided that the projecting electrodes 7 are mounted on a mounting board (not shown) in the following conditions: the second semiconductor chip 1b has a thickness of 0.15 mm; the connection electrodes 2 for connecting the second semiconductor chip 1b to the wiring substrate 3 have a height of 30 $\mu$m; the electrodes 4 on the wiring substrate 3 have a thickness of 20 $\mu$m; and the warping amount of the wiring substrate is 10 $\mu$m, spacing of about 30 $\mu$m can be assured between the second semiconductor chip 1b and the mounting board even if the warping is recovered by 10 $\mu$m when mounted on the mounting board.

By assuring this spacing, the second semiconductor chip 1b will not contact the mounting board even if the semiconductor device 10 is pressed against the mounting board by external pressure and the like.

Thus, the semiconductor device 10 can be manufactured with the wiring substrate 3 being in a warped state.

Note that, in the present embodiment, flip chip bonding is exemplarily shown as a method for mounting the electronic component 1a onto the wiring substrate 3. More specifically, an anistropic conductive adhesive film (an epoxy resin film containing conductive particles) was formed on the wiring substrate 3, and a heated semiconductor chip was pressed against the resultant wiring substrate 3. Since the anistropic conductive adhesive film is formed from, e.g., a thermosetting epoxy adhesive, the resin is cured while the electronic component 1a is being pressed against the wiring substrate 3 with heating.

Alternatively, flip chip bonding using solder may be employed. An alloy such as lead tin or silver tin is used as solder, and the solder can be formed by, e.g., vapor deposition, printing of solder paste, ball bonder and the like. Instead of the solder, a material such as gold and copper may be used. In this case, connection can be realized with a conductive adhesive or conductive particles interposed between the connection electrodes 2 and the electrodes 2 of the wiring substrate 3. Alternatively, connection may be realized with solder interposed between the connection electrodes 2 and the electrodes 4 of the wiring substrate 3. Instead of the flip chip bonding, wire bonding may be used.

For example, a printed board or a resin material such as a polyimide resin is used as the wiring substrate 3. It is now assumed that the electrodes 4 of the electronic component 1a and the second semiconductor chip 1b are to be formed at small intervals (100 µm or less). Since electrodes cannot be formed at small intervals on the print board, a built-up substrate can be used that has a fine wiring layer formed in a resin layer on the printed board by plating or the like.

Seventh Embodiment

Figure 7A:
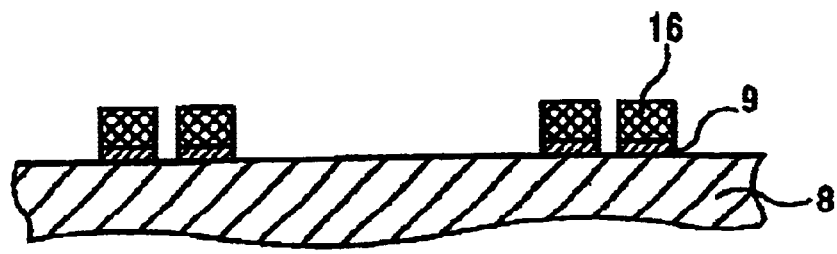
FIGS. 7A, 7B and 7C are process charts illustrating a method for manufacturing an electronic equipment according to a seventh embodiment of the present invention.
Figure 7B:
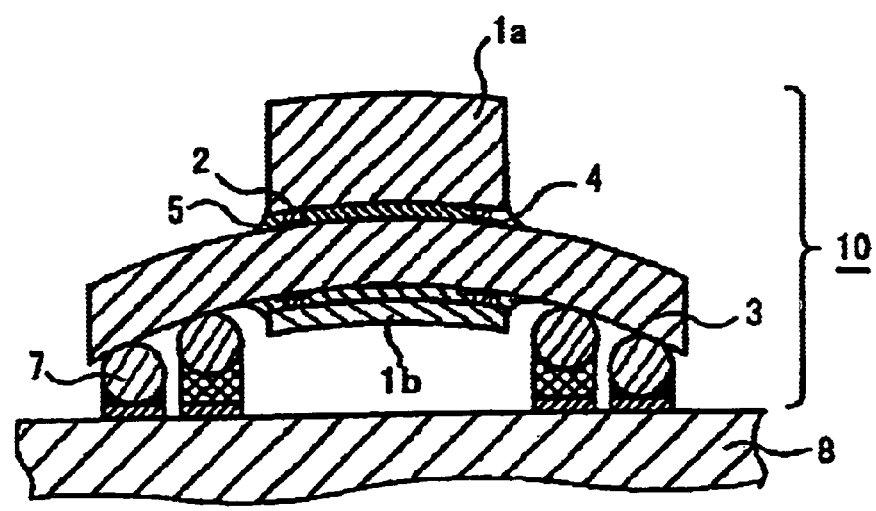
Figure 7C:
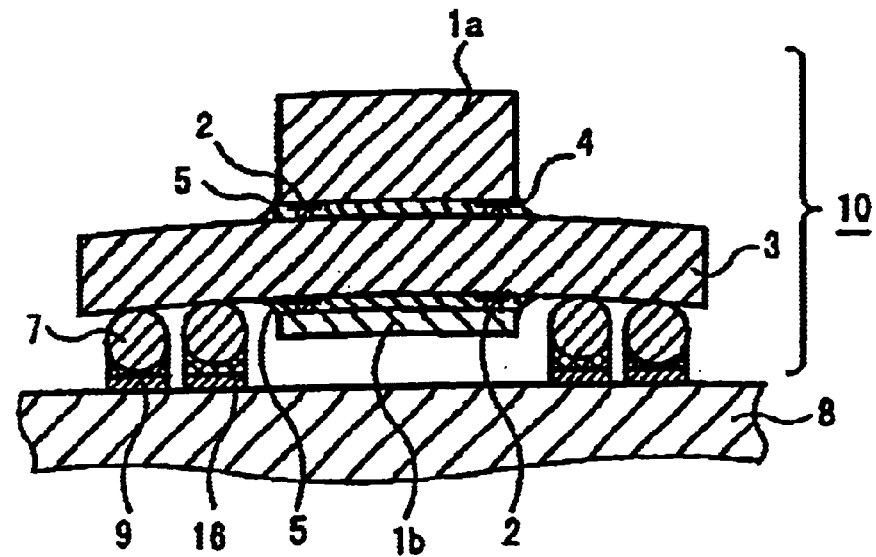

FIGS. 7A, 7B and 7C are process charts illustrating a method for manufacturing an electronic equipment according to the seventh embodiment of the present invention. In the present embodiment, as shown in FIG. 7A, a conductive connecting material 16 is formed on electrodes 9 of a mounting board 8. For example, the conductive connecting material 16 is a cream-like material of fine solder particles dissolved in a solvent, and is formed by printing. The height of the conductive connecting material 16 depends on the spacing between the electrodes, and is about 0.1 mm when the spacing between the electrodes is 0.5 mm.

FIG. 7B shows the state in which a semiconductor device 10 is mounted on the mounting board 8 after the electrodes 9 on the mounting board 8 are aligned with projecting electrodes 7 of the semiconductor device 10 (no heating was conducted). The warping amount of the wiring substrate 3 is herein within 100 µm so that the projecting electrodes 7 of the semiconductor device 10 sufficiently contact the conductive connecting material 16.

FIG. 7C shows the state in which the mounting board was heated at about 240° C. to melt the solder, and then cooled to room temperature. When a glass epoxy resin containing glass fiber is used as the mounting board, the mounting board has a smaller linear expansion coefficient than the wiring substrate 3 formed from a resin material or a composite material containing a resin material at a high ratio. Therefore, thermal contraction of the mounting board is smaller than the wiring substrate, so that warping of the wiring substrate 3 is reduced as compared to the state of FIG. 7B.

In the present embodiment, the warping amount reduced in the state of FIG. 7C from the state of FIG. 7B was about 10 µm. Accordingly, the spacing of several tens of micrometers was able to be assured between the second semiconductor chip 1b and the mounting board 8.

Note that an example in which the conductive connecting material 16 has a height of 100 µm is shown in the present embodiment. However, as the spacing between the electrodes 9 decreases, the height of the conductive connecting material 16 must be reduced. Accordingly, in order to assure the spacing between the second semiconductor chip 1b and the mounting board 8, the warping amount of the wiring substrate 3 need only be determined as appropriate.

Although the warping amount of the wiring substrate 3 is herein 100 µm or less, it is preferably in the range of about 10 to 40 µm.

Eighth Embodiment

Figure 8:
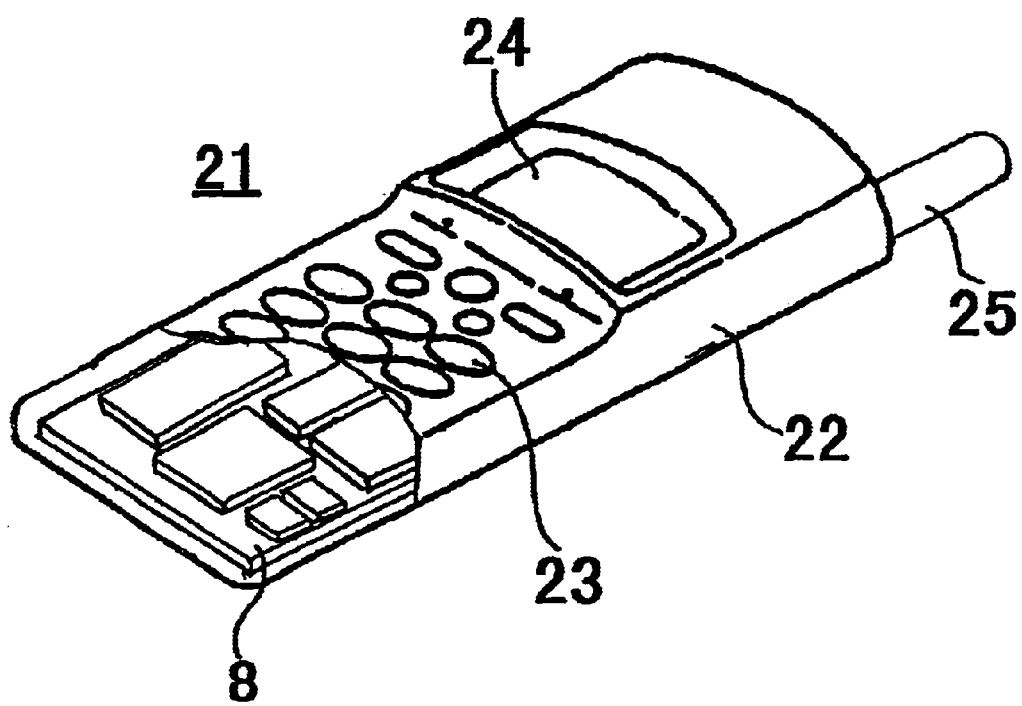
FIG. 8 is a perspective view showing the schematic structure of a portable information terminal according to an eighth embodiment of the present invention.
Figure 9:
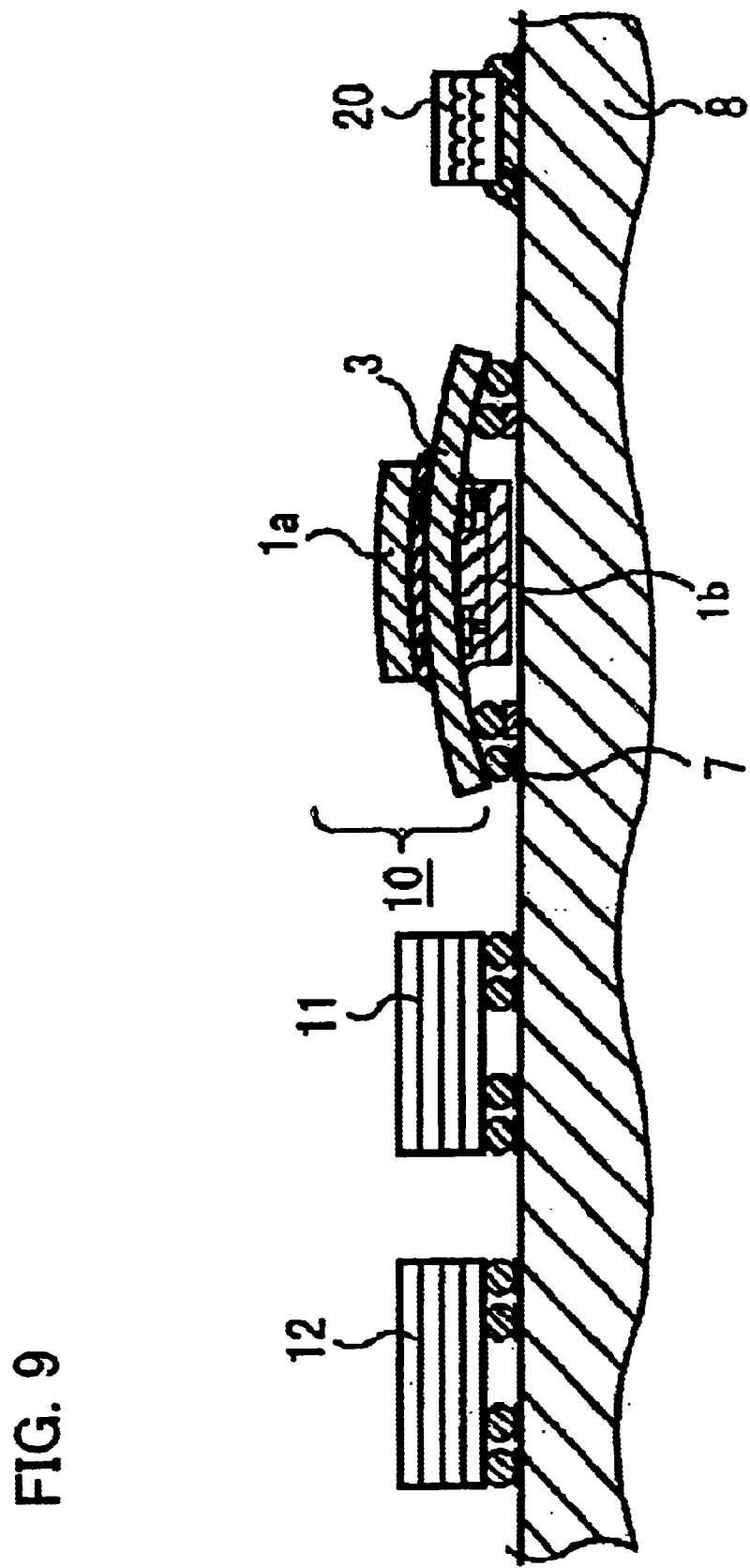
FIG. 9 is a cross-sectional view showing the schematic structure of the portable information terminal according to the eighth embodiment of the present invention.

FIG. 8 is a perspective view of the schematic structure of a portable information terminal according to the eighth embodiment of the present invention, and FIG. 9 is a cross-sectional view of the schematic structure of the portable information terminal according to the eighth embodiment of the present invention, showing a signal processing region of a mounting board.

FIG. 8 shows the schematic structure of a mobile phone as an example of the portable information terminal, and the mobile phone 21 includes a housing 22, a keypad portion 23, a display 24, an antenna 25, a mounting board 8 having a plurality of devices mounted thereon, a battery (not shown) and the like.

FIG. 9 shows a signal processing region of the mounting board 8 mounted in the housing 22. The mounting board 8 have mounted thereon a logic LSI 11 having CPU function to conduct basic signal processing of the portable information terminal, a memory package 12, a chip component 20 such as resistor and capacitor, and a semiconductor device 10. The semiconductor device 10 is formed from a logic LSI (electronic component) 1a, a logic LSI (semiconductor chip) 1b, and a wiring substrate 3, and mounted on the mounting board 8 with projecting electrodes 7.

For example, the use of a logic LSI having both image signal processing function requiring mass memory function and memory function as the logic LSIs 1a and 1b would be preferable in view of reduction in area, thickness and costs.

Although an example in which the logic LSI 11 and the memory package 12 are separately mounted is shown in the present embodiment, a wiring substrate may be used to mount the logic LSI 11 and the memory package 12 on both surfaces thereof.

Ninth Embodiment

Figure 10:
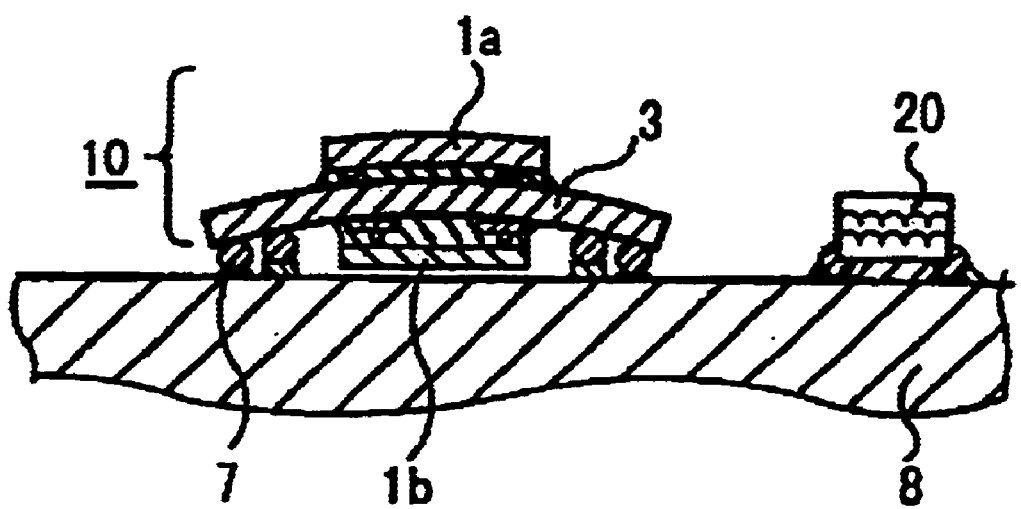
FIG. 10 is a cross-sectional view showing the schematic structure of a portable information terminal according to a ninth embodiment of the present invention.
Figure 11:
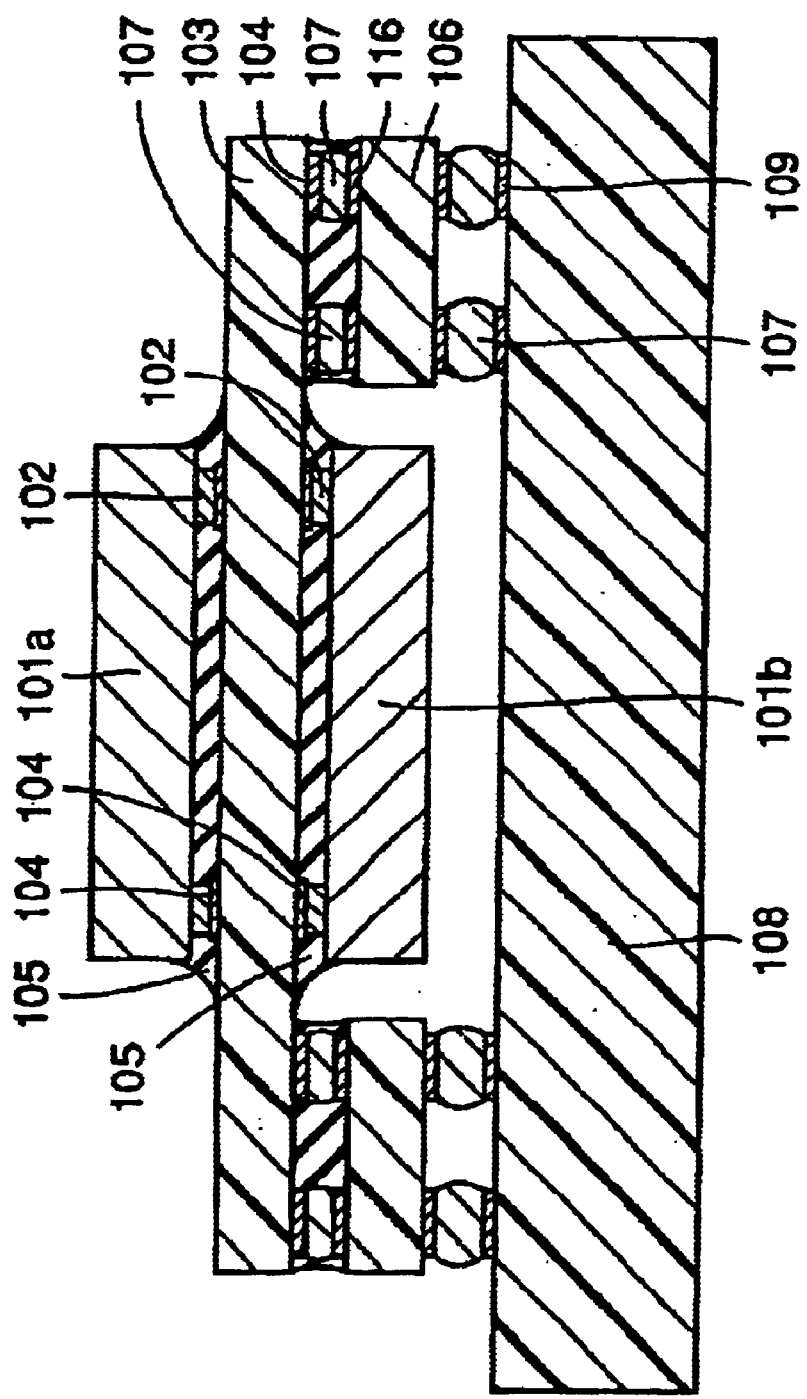
FIG. 11 is a cross-sectional view showing the schematic structure of a conventional semiconductor device.
Figure 12:
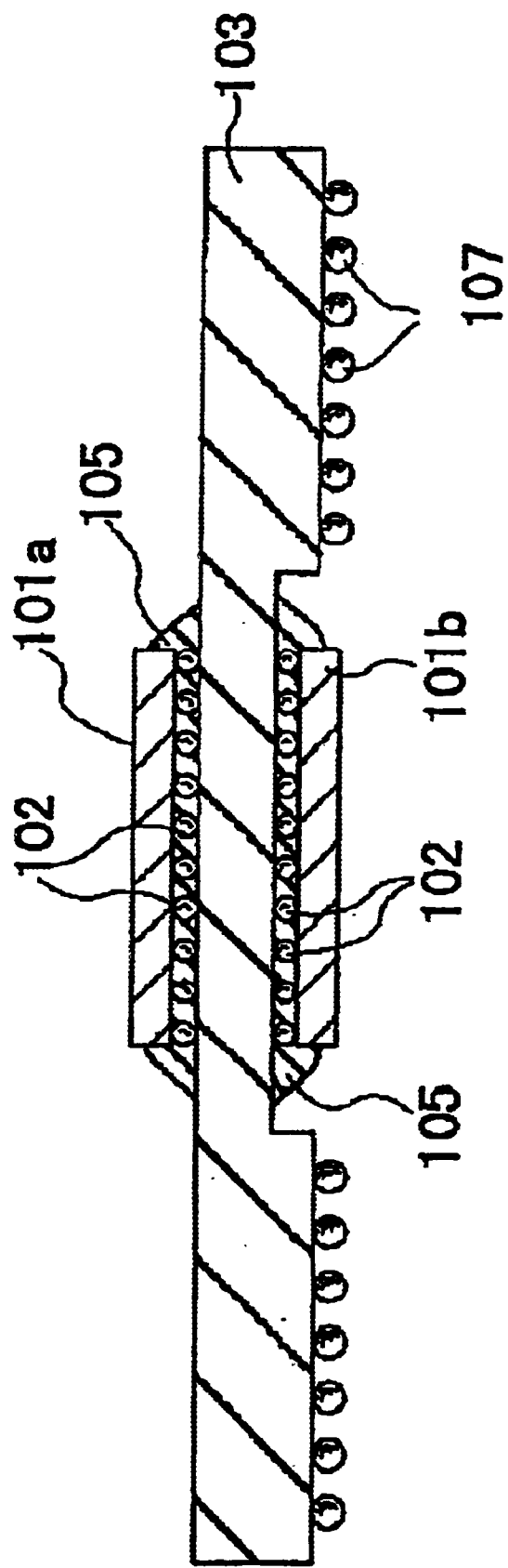
FIG. 12 is a cross-sectional view showing the schematic structure of a conventional semiconductor device.
Figure 13:
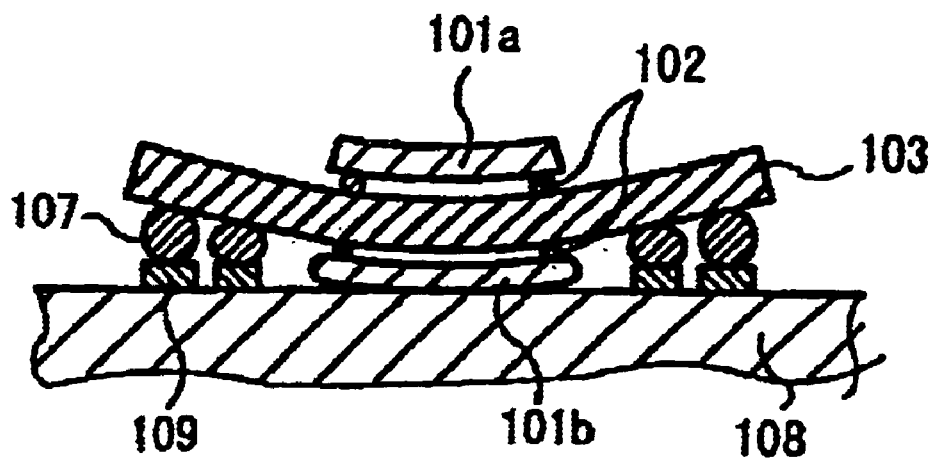
FIG. 13 is a cross-sectional view showing the schematic structure of a conventional semiconductor device.

FIG. 10 is a cross-sectional view of the schematic structure of a portable information terminal according to the ninth embodiment of the present invention, showing a signal processing region of a mounting board.

In the figure, 8 denotes a mounting board mounted in the housing 22, and having mounted thereon a semiconductor device 10 and a chip component 20 such as resistor and capacitor. The semiconductor device 10 is formed from a logic LSI (electronic component) 1a, a logic LSI (semiconductor chip) 1b and a wiring substrate 3, and mounted on the mounting board 8 with projecting electrodes 7.

The logic LSI 1a and the logic LSI 1b have CPU function to conduct basic signal processing of a portable information terminal, additional function such as image signal processing, and memory function.

Although an example in which the semiconductor device 10 is formed from two logic LSIs is shown in the present embodiment, the semiconductor device 10 may be formed from a plurality of semiconductor chips, and at least one of the plurality of semiconductor chips may not have logic function.

Since the semiconductor devices 10 of the present embodiment and the eight embodiment are manufactured with the structure of any one of the first to sixth embodiments, or by the manufacturing method of the seventh embodiment, a thin semiconductor device having a high mounting density can be formed at low costs.

Moreover, since a logic LSI is mounted on both sides of the wiring substrate 3, warping of the wiring substrate 3 can be reduced as compared to the case where a logic LSI is mounted only on one side. Moreover, since the logic LSI 1a and the logic LSI 1b have different thickness or different linear expansion coefficient so as to implement appropriate warping, the logic LSI 1b will not contact the mounting board 8. Particularly in the portable information terminal, the mounting board is bent due to external pressure such as bending or torsion applied thereto when in use. Therefore, the spacing between the logic LSI 1b and the surface of the mounting board 8 was set to about 30 μm.

INDUSTRIAL APPLICABILITY

As has been described above, a semiconductor device, a method for manufacturing an electronic equipment, an electronic equipment and a portable information terminal according to the present invention are suitable for use in a semiconductor device requiring a high mounting density of semiconductor chips, and an electronic equipment such as portable information terminal, and for use in manufacturing thereof.

What is claimed is:

1. A semiconductor device, comprising: a wiring substrate including electrodes on a top surface and a back surface thereof; projecting electrodes formed on one surface of said wiring substrate so as to have a prescribed height; a semiconductor chip having a thickness smaller than said height of said projecting electrodes and mounted on said one surface of said wiring substrate so as to be electrically connected to said electrodes of said wiring substrate; and an electronic component having a thickness larger than that of said semiconductor chip and mounted on the other surface of said wiring substrate so as to be electrically connected to said electrodes of said wiring substrate so that said wiring substrate is warped to be recessed at said one surface.

2. The semiconductor device according to claim 1, wherein a linear expansion coefficient of said electronic component is smaller than that of said wiring substrate.

3. The semiconductor device according to claim 1, wherein a value of a linear expansion coefficient of said electronic component is equal to or less than that of said semiconductor chip.

4. The semiconductor device according to claim 1, wherein the warping is bowl-shaped warping, and a difference in level between a central portion and a peripheral portion of said wiring substrate is equal to or less than 100 μm.

5. The semiconductor device according to claim 1, wherein said electronic component is a lamination of a plurality of semiconductor chips.

6. The semiconductor device according to claim 1, wherein said electronic component has a thickness of 0.3 mm or more.

7. The semiconductor device according to claim 1, wherein said electronic component is larger than said semiconductor chip in two-dimensional size.

8. The semiconductor device according to claim 1, wherein said wiring substrate is a resin substrate.

9. A semiconductor device, comprising:
    a wiring substrate including electrodes on a top surface and a back surface thereof;
    projecting electrodes formed on one surface of said wiring substrate so as to have a prescribed height;
    a semiconductor chip having a thickness smaller than said height of said projecting electrodes and mounted on said one surface of said wiring substrate so as to be electrically connected to said electrodes of said wiring substrate; and
    an electronic component mounted on the other surface of said wiring substrate so as to be electrically connected to said electrodes of said wiring substrate so that said wiring substrate is warped to be recessed at said one surface, said electronic component having a thickness larger than that of said semiconductor chip and having a linear expansion coefficient smaller than that of said wiring substrate.

10. The semiconductor device according to claim 9, wherein said wiring substrate is a resin substrate.

11. The semiconductor device according to claim 9, wherein said electronic component has a thickness of 0.3 mm or more.

12. An electronic equipment, comprising:
    a mounting board;
    a wiring substrate including electrodes on a top surface and a back surface thereof and mounted on said mounting board with projecting electrodes interposed therebetween, said projecting electrodes having a prescribed height;
    a semiconductor chip having a thickness smaller than said height of said projecting electrodes and mounted on a surface of said wiring substrate facing said mounting board such that said semiconductor chip is disposed in a space between said mounting board and said wiring substrate and electrically connected to said electrodes of said wiring substrate; and
    an electronic component mounted on a surface of said wiring substrate opposite to that facing said mounting board such that said electronic component is electrically connected to said electrodes of said wiring substrate so that said wiring substrate is warped to be recessed at said surface facing said mounting board, said electronic component having a thickness larger than that of said semiconductor chip and having a linear expansion coefficient smaller than that of said wiring substrate.

13. The electronic equipment according to claim 12, wherein said wiring substrate is a resin substrate.

14. The electronic equipment according to claim 12, wherein said electronic component has a thickness of 0.3 mm or more.

15. A portable information terminal, comprising:
    a housing;
    a mounting board mounted in said housing;
    a first logic LSI chip mounted on said mounting board;
    a wiring substrate including electrodes on a top surface and a back surface thereof and mounted on said mounting board with projecting electrodes interposed therebetween, said projecting electrodes having a prescribed height;

a memory or second logic LSI chip having a thickness smaller than said height of said projecting electrodes and mounted on a surface of said wiring substrate facing said mounting board such that said memory or second logic LSI chip is disposed in a space between said mounting board and said wiring substrate and electrically connected to said electrodes of said wiring substrate; and an electronic component mounted on a surface of said wiring substrate opposite to that facing said mounting board such that said electronic component is electrically connected to said electrodes of said wiring substrate so that said wiring substrate is warped to be recessed at said surface facing said mounting board, said electronic component having a thickness larger than that of said memory or second logic LSI chip and having a linear expansion coefficient smaller than that of said wiring substrate.

* * * * *